(12) United States Patent
Bharti et al.

(10) Patent No.: US 7,777,397 B2
(45) Date of Patent: Aug. 17, 2010

(54) MULTILAYER CONDUCTIVE ELEMENTS

(75) Inventors: Vivek Bharti, Cottage Grove, MN (US); Matthew J. Michel, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 213 days.

(21) Appl. No.: 11/684,700

(22) Filed: Mar. 12, 2007

(65) Prior Publication Data

US 2008/0224566 A1 Sep. 18, 2008

(51) Int. Cl.
H01L 41/047 (2006.01)
H01L 41/22 (2006.01)
(52) U.S. Cl. ............... 310/365; 310/366; 29/25.35
(58) Field of Classification Search .......... 310/311, 310/365, 366; 29/25.35
See application file for complete search history.

(56) References Cited

U.S. PATENT DOCUMENTS

| | | | |
|---|---|---|---|
| 3,761,211 A | 9/1973 | Parkinson | |
| 3,884,606 A | 5/1975 | Schrenk | |
| 3,924,990 A | 12/1975 | Schrenk | |
| 4,322,877 A | 4/1982 | Taylor | |
| 4,328,441 A | 5/1982 | Kroeger, Jr. et al. | |
| 4,330,730 A | 5/1982 | Kurz et al. | |
| 4,405,402 A | 9/1983 | Quilliam | |
| 4,606,871 A | 8/1986 | Krueger et al. | |
| 4,627,138 A | 12/1986 | Im | |
| 4,820,586 A | 4/1989 | Krueger et al. | |
| 5,153,859 A | 10/1992 | Chatigny et al. | |
| 5,783,120 A | 7/1998 | Ouderkirk et al. | |
| 5,825,543 A | 10/1998 | Ouderkirk et al. | |
| 5,997,800 A | 12/1999 | Friedl et al. | |
| 6,143,216 A | 11/2000 | Loch et al. | |
| 6,933,051 B2 | 8/2005 | Fleming et al. | |
| 6,949,283 B2 | 9/2005 | Kollaja et al. | |
| 2003/0006669 A1 | 1/2003 | Pei et al. | |
| 2003/0007038 A1 | 1/2003 | Nakatani | |
| 2003/0153965 A1* | 8/2003 | Supronowicz et al. | 607/116 |
| 2004/0109236 A1* | 6/2004 | Nishioka | 359/643 |
| 2005/0046030 A1* | 3/2005 | Nakamura | 257/758 |
| 2006/0147701 A1 | 7/2006 | Lockridge | |

FOREIGN PATENT DOCUMENTS

| | | |
|---|---|---|
| JP | 8-276537 | 10/1996 |
| JP | 2000-127176 | 5/2000 |
| WO | WO 02/096647 A1 | 12/2002 |
| WO | WO 2006/118059 A1 | 11/2006 |

OTHER PUBLICATIONS

Yoon, C-B., et al., "Multilayer Bender-Type PZT-PZN Actuator by Co-Extrusion Process," Journal of the European Ceramic Society, vol. 26 (2006) pp. 2345-2348.

* cited by examiner

*Primary Examiner*—Walter Benson
*Assistant Examiner*—Derek J Rosenau
(74) *Attorney, Agent, or Firm*—Stephen L. Crooks (57) ABSTRACT

An article comprises first and second electrically responsive elements having a cutting plane which is perpendicular to an x-dimension for separating the elements. The conductive elements of the conductive layers are alternatingly exposed to one of the two opposing faces of the conductive element.

18 Claims, 7 Drawing Sheets

MULTILAYER CONDUCTIVE ELEMENTS

FIELD

The present invention relates to an article comprising electrically responsive elements.

BACKGROUND

Multilayer sheets and other articles formed by coextrusion techniques are known in the art. Coextrusion of polymeric webs can occur by passing different melt streams from different extruders into a multiple layer feed block and a film die, or into a multiple manifold die. The feedblock technique merges at least two different materials in a feedblock and then feeds them to a die as a layered stack, which becomes a layered sheet as it leaves the die. A multiple manifold die, combines different molten streams from different extruders at a die lip.

Coextrusion of polymers has been used to form polymeric webs with discontinuous layers of at least one polymeric material within a matrix of another polymeric material. Some examples of multilayer articles include tape backings, medical articles, and electrical devices Conductive articles may have at least one nonconductive layer in between two conductive layers, which is dependent on the application requirements. These articles may comprise multiple layers through extrusion and other known stacking techniques thus producing a single device. Some examples of conductive articles include piezoelectric devices, pyroelectric devices, actuators, and sensors. Electrical voltage applied to the articles may deform the article, or when the article is under a mechanical stress, an electrical voltage may be produced. Example of multilayered conductive structures are described in U.S. Pat. Nos. 4,405,402 (Quilliam); 4,330,730 (Kurz et al.); and 4,627,138 (Im).

SUMMARY

Multilayer electrically responsive elements are described. The article of this disclosure comprises a first and second electrically responsive element having alternating conductive and nonconductive layers extending in a z-dimension. The elements have three mutually orthogonal dimensions, being an x-, y-, and z-dimensions. The elements have two opposing faces coincident and parallel with a y-z plane. A cutting plane is coincident and parallel with the two opposing faces. The conductive layers contain alternating conductive and nonconductive regions extending in the x-direction. The conductive regions are arranged so that either a first or second surface of each element of each successive conductive layer is alternatively exposed to one of the two opposing faces. The first or second surface not exposed to one of the two opposing faces does not extend to the next face. The non-exposed surface is adjacent to a nonconductive region, which extends in the x-dimension to the next face of the element. The nonconductive region is adjacent to another first or second surface of another conductive region. The two opposing faces are parallel to the first or second surface of each of the conductive regions. The first and second electrically responsive elements are separated by a cutting plane defined by the y- and z-dimensions of the article (i.e., a y-z plane), which is perpendicular to the x-dimension.

In one embodiment, the electrically responsive elements repeat in the x-dimension.

In one aspect, the electrically responsive article comprises elastomeric conductive layers and elastomeric nonconductive layers.

The multilayer articles described herein have at least two electrically responsive elements which can be essentially defect free in comparison to independently hand layered/stacked films. The article may be formed by consolidating multiple layers at a die feedblock, and subsequently passing the multilayered article through a die orifice, where the article may be drawn down to a desired width or thickness. One or more cutting planes can be used for separating the elements at one of the two opposing faces. The multilayered article of this disclosure may be coextruded without using greater than two extruders to provide for a number of elements repeating in the x-dimension having alternating conductive and nonconductive layers of controlled thicknesses.

Electrically responsive articles made of polymeric materials offer advantages over ceramic articles. Advantages include mechanical flexibility, reduced weight, robust processing, low cost, and the ability to make sheet or complex shapes of a desirable configuration. Advantages of the inventive multilayered articles include lower driving voltage, controlled driving force, and higher sensitivity.

DETAILED DESCRIPTION

For the following defined terms, these definitions shall be applied, unless a different definition is given in the claims or elsewhere in the specification.

The term "electrically responsive" refers to an element which may store, develop or accept an electrical charge. Electrically responsive elements may be used as a component in devices such as actuators, sensors, capacitors, pyroelectric devices and piezoelectric devices. These elements typically comprise alternating layers of conductive and nonconductive materials.

The term "cutting plane" (i.e., cutting location) refers to an imaginary plane in relation to a three-dimensional object. For example, a cutting plane oriented in a y-z plane is useful for separating individual electrically responsive elements. The cutting plane or cutting location is perpendicular to the x-dimension of the article for dividing the elements, where faces of the alternating conductive regions of the conductive layer are exposed and coincident to one of the two faces of the element after separation.

The term "unit cell" refers to the element which repeats or extends along a dimension being divisible. For example, a unit cell for an electrically responsive element comprises at least one nonconductive layer and at least two conductive layers. The nonconductive layer is located in between the conductive layers. The unit cell is separable from a plurality of unit cells extending in the x-dimension at a y-z cutting plane.

The term "interstices" refers to a space between things or parts. For example, the interstices between the conductive regions of the conductive layer refer to the space between the regions extending in the x-dimension. The interstices of an electrically responsive element may contain polymeric nonconductive material. The interstices may also be referred to as nonconductive regions.

The term "reference plane" refers to an imaginary plane in relation to a three-dimensional object. For example, a reference plane oriented in a y-z plane is coincident and parallel to the surface of the conductive regions of the conductive layer, or to a face of an article or electrically responsive element. The reference plane is perpendicular to the x-dimension and parallel to the cutting plane(s). The reference plane may also be a cutting plane.

The term "draw down" refers to the ratio of the die orifice measurement relative to the finished article measurement in the z-dimension. The die orifice measurement is taken from a standard extrusion die to control the level or extent of extension of an article prior to entering the orifice and the extension of the article after exiting the die.

The recitation of numerical ranges by endpoints includes all numbers subsumed within that range (e.g., 1 to 5 includes 1, 1.5, 2, 2.75, 3, 3.8, 4, and 5).

As included in this specification and the appended claims, the singular forms "a", "an", and "the" include plural referents unless the content clearly dictates otherwise. Thus, for example, reference to a composition containing "a compound" includes a mixture of two or more compounds. As used in this specification and appended claims, the term "or" is generally employed in its sense including "and/or" unless the content clearly dictates otherwise.

Unless otherwise indicated, all numbers expressing quantities or ingredients, measurement of properties and so forth used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings of the present disclosure. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the disclosure are approximations, the numerical values set forth in the specific examples are reported as precisely as possible. Any numerical value, however, inherently contains errors necessarily resulting from the standard deviations found in their respective testing measurements.

The present disclosure describes an article and a method for making an article. The article comprises multiple layered elements for applications in electrical devices. The elements are unpolarized, and may be used as a component of a device as described below.

Figure 1:
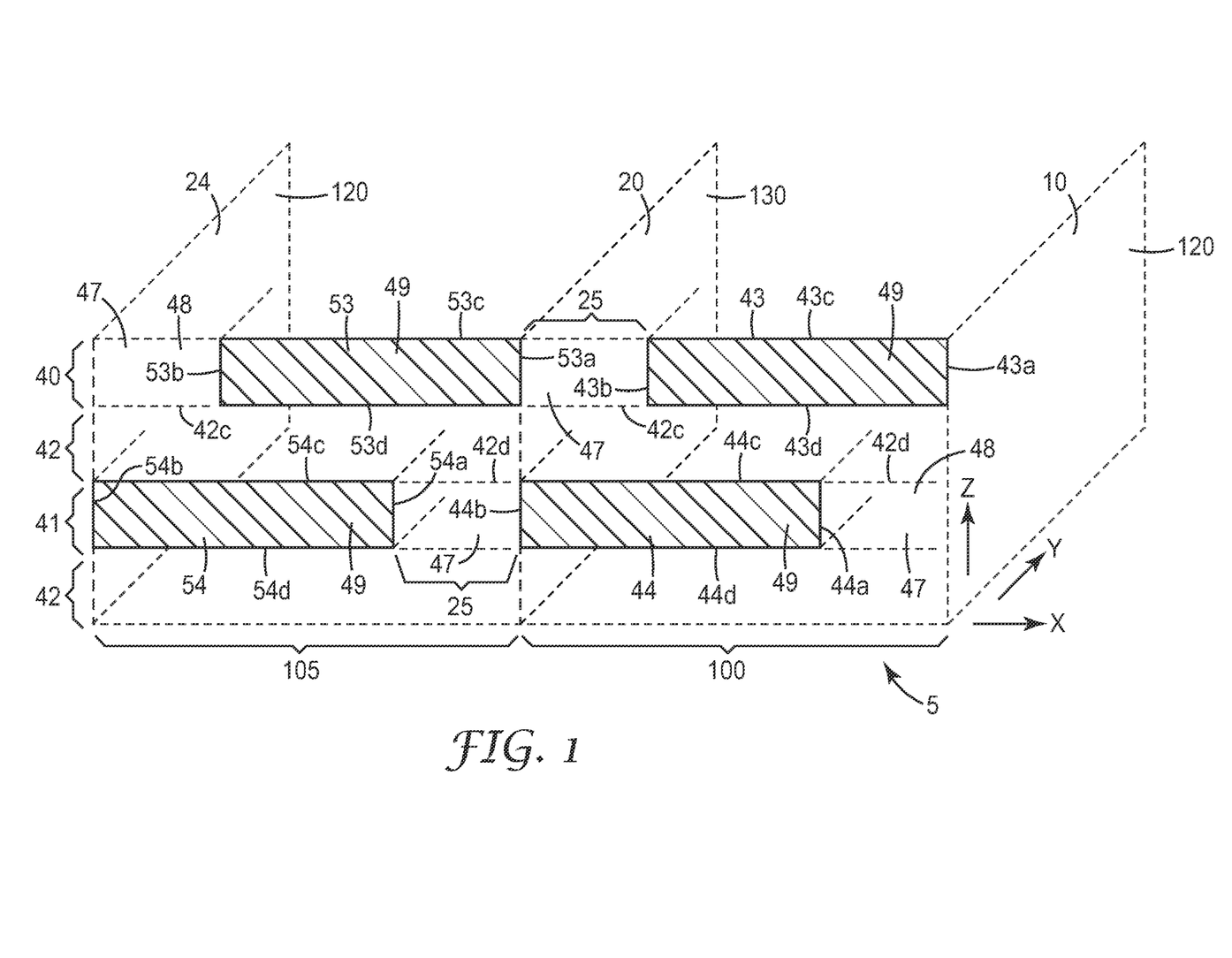
FIG. 1 is a schematic representation of an article having at least two electrically responsive elements.

A representative article 5 of this disclosure comprises first 100 and second 105 electrically responsive elements as illustrated in FIG. 1. An electrically responsive element 100 is further described in U.S. Pat. Nos. 4,627,138 (Im); 5,997,880 (Friedl et al.); 5,153,859 (Chatigny et al.); and International Publication No. WO 02/096647A1 (Hilmas et al.). Article 5 comprises first 100 and second 105 electrically responsive elements, which are unpoled, and extend along an x-dimension. Each of the electrically responsive elements 100, 105 has three mutually orthogonal dimensions, an x-, a y- and a z-dimension. The elements 100, 105 contain alternating conductive 40, 41 and nonconductive 42 layers. The conductive layers 40, 41 comprise regions 43, 53, 44, 54 of polymeric conductive material 49 and regions 48 of polymeric nonconductive material 47; and the nonconductive layer 42 comprises polymeric nonconductive material 47. The article 5 further comprises a cutting plane 20 which is useful for separating the first 100 and second 105 elements. The cutting plane 20 is perpendicular to the x-dimension and parallel to the y-z plane.

The first 40 and second 41 conductive layers each have conductive regions 43, 53, 44, 54. The first conductive layer 40 has first 43 and second 53 conductive regions, and the second conductive layer 41 has third 44 and fourth 54 conductive regions. The conductive regions 43, 53, 44, 54 are arranged as illustrated in FIG. 1, so that a first surface 43a, 53a of first 43 and second 53 conductive regions of first conductive layer 40 and a second surface 44b, 54b of third 44 and fourth 54 conductive regions of second conductive layer 41 are alternatingly exposed to one of two opposing faces 120, 130 of the elements 100, 105. The first 120 and second 130 faces are coincident to first 43a, 53a and second surfaces 44b, 54b of each respective conductive region 43, 53 and 44, 54. Further, first 120 and second 130 opposing faces are parallel to the cutting 20, 24 and reference 10 planes. The two faces 120, 130 are exposed to recover a single electronically responsive element 100 after separation at one or more cutting planes 20 or at a reference plane 10 and a cutting plane 20.

The x-dimension refers to the width or cross-web dimension, the y-dimension refers to the depth or down-web dimension, and the z-dimension refers to the thickness or height of the article 5 having at least two electrically responsive elements 100, 105. Analogously, the y-z plane corresponds to a plane having y- and z-dimensions, whereas an x-z plane corresponds to a plane having x- and z-dimensions. The x-y plane corresponds to a plane having x- and y-dimensions.

The x-dimension of the article 5 comprising at least two elements 100, 105 refers to the width or cross-web dimension of the article 5, and the subsequent electrically responsive elements 100, 105 resulting from the article 5 after separating at a cutting plane 20. The x-dimension of an element 100 may be in a range of 0.01 micrometer to 1 centimeter. Preferably, the x-dimension is in a range of 1 micrometer to 0.1 centimeter, and more preferably, the x-dimension is in a range of 10 micrometers to 0.01 centimeter.

The y-dimension relates to the length or down-web dimension of an article comprising at least two elements 100, 105. The y-dimension also refers to the elements 100, 105 after separation by a cutting plane 20 from the article 5. The elements 100, 105 may each have a specific y-dimension as determined by a given application. The element 100 may be separated from the article 5 in the x-z plane, which is perpendicular to the y-dimension. The y-dimension of the element 100 may be in a range of 0.01 micrometer to 1 centimeter. Preferably, the y-dimension is in a range of 1 micrometer to 0.1 centimeter, and more preferably, the y-dimension is in a range of 10 micrometers to 0.01 centimeter.

The z-dimension relates to the thickness or height of an article 5 comprising at least two electronically responsive elements 100, 105. The z-dimension may vary with respect to the number of alternating layers of conductive and nonconductive material as the material is extruded through a die orifice of an extrusion apparatus and the degree of drawdown of the multiple layers during coextrusion. The z-dimension of each of the elements 100, 105 may be in a range of 3 micrometers to 3 millimeters. The z-dimension of the article 5 after exiting the die orifice may be different relative to the z-dimension of the article 5 after draw down. Preferably, the z-dimension is in a range of 10 micrometer to 0.5 millimeters, and more preferably, the z-dimension is in a range of 25 micrometer to 0.05 millimeters.

In FIG. 1, the first 100 and second 105 electrically responsive elements of article 5 have first 20 and second 24 cutting planes, and a reference plane 10. The reference plane 10 of the article may also function as one of the cutting planes 20, 24. The reference 10 and cutting planes 20, 24 each are parallel with respect to one other in the y-z plane, and similarly to the faces 120, 130 of the elements 100, 105. The reference 10 and cutting 20, 24 planes separate the elements 100, 105 from one other exposing the alternating layers of conductive material 49 of the conductive layers 40, 41 on one of the two faces 120, 130. Separation of the elements 100, 105 may be accomplished with techniques including die cutting, laser cutting, shear slitting, score slitting, hot wire engaged slitting and combinations thereof. A trim portion or inoperative element of the article 5 extending in the x-direction away from either of the faces 120, 130 may result after separation of the elements 100, 105 at a reference 10 or cutting 20, 24 planes. The trim portion or inoperable element may comprise irregularly shaped surfaces or faces formed during extrusion through a die orifice and drawdown of the article 5. The trim portion may be recycled for other applications.

The article 5 contains alternating conductive 40, 41 and nonconductive 42 layers extending in the z-dimension as illustrated in FIG. 1. The alternating conductive 40, 41 nonconductive 42 layers are continuous in the y-dimension. The conductive layers 40, 41 are discontinuous in the x-dimension, and comprise polymeric conductive material 49. The nonconductive layer 42 comprises nonconductive polymeric material 47 which is continuous in the x-dimension.

The first 40 and second 41 conductive layers of FIG. 1 each comprise at least two conductive regions. The first conductive layer 41 contains first 43 and second 53 conductive regions, and the second conductive layer 41 contains third 44 and fourth 54 conductive regions. Conductive regions 43, 53 and 44, 54 are discontinuous in the x-dimension, and continuous in the y-dimension. First conductive region 43 of the first conductive layer 40 has a first surface 43a, second surface 43b, a third surface 43c, and a fourth surface 43d. Second conductive region 53 of the first conductive layer 40 has a first surface 53a, second surface 53b, a third surface 53c, and a fourth surface 53d. Conductive regions 43, 53 are discontinuous in the x-dimension having interstices 25 containing nonconductive material 47. Similarly, third conductive region 44 of the second conductive layer 41 has a first surface 44a, second surface 44b, a third surface 44c and a fourth surface 44d. Fourth conductive region 54 of the second conductive layer 41 has a first surface 54a, a second surface 54b, a third surface 54c, and a fourth surface 54d. Third and fourth conductive regions 44, 54 are also discontinuous in the x-dimension having interstices 25 containing nonconductive material 47. Nonconductive layer 42 comprises nonconductive material 47 which extends continuously in the x- and y-dimensions.

A cross-section of article 5 as illustrated in FIG. 1 has at least two electrically responsive elements 100, 105 in the x-z plane. The cross-section shows a nonconductive layer 42 having a third 42c and fourth 42d surfaces. The nonconductive layer 42 is located in between a first 40 and second 41 conductive layers. The first conductive layer 40 is adjacent to the third surface 42c of the nonconductive layer 42, and the second conductive layer 41 is adjacent to the fourth surface 42d of the nonconductive layer 42. The first conductive layer 40 has at least first 43 and second 53 conductive regions, and the second conductive layer 41 has at least third 44 and fourth 54 conductive regions, where the interstices 25 between conductive regions 43, 53, 44, 54 may contain a polymeric nonconductive material 47. Conductive regions 43, 53 and 44, 54 of conductive layers 40 and 41, respectively, repeat in the x-dimension.

Figure 2:
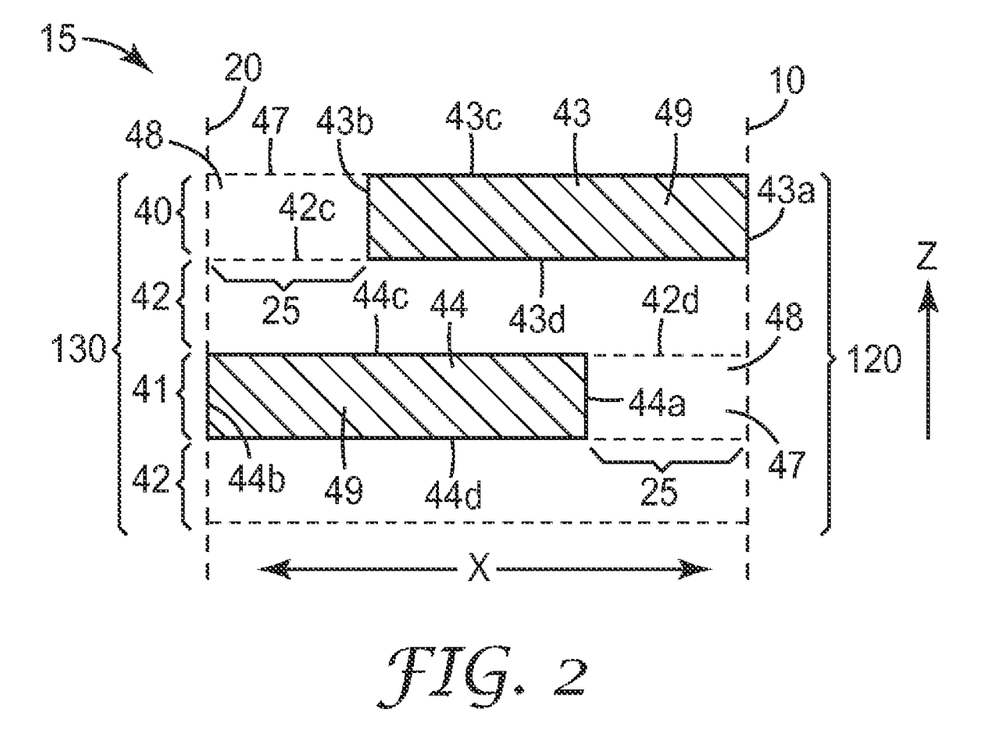
FIG. 2 is a schematic representation of a unit cell.

FIG. 2 illustrates an electrically responsive element 100, 105 of an article 5, where each element 100, 105 is made from a unit cell 15. The unit cell 15 comprises at least one nonconductive layer 42 comprising nonconductive material 47, which has third 42c and fourth 42d surfaces that are continuous along two substantially orthogonal axes, the x- and y-dimensions. The unit cell 15 further comprises at least first 40 and second 41 conductive layers comprising conductive material 49 that are discontinuous in the x-dimension, where the first conductive layer 40 comprises a first conductive region 43, and the second conductive layer 41 comprises a third conductive region 44. First conductive region 43 has a first surface 43a, a second surface 43b, a third surface 43c, and a fourth surface 43d. Third conductive region 44 has a first surface 44a, a second surface 44b, a third surface 44c, and a fourth surface 44d. The first surface 43a of the first conductive region 43 of the first conductive layer 40 is coincident with a reference plane 10, where the second surface 43b of the first conductive region 43 does not extend to the cutting plane 20. The second surface 44b of the third conductive region 44 of the second conductive layer 41 is coincident with a cutting plane 20, where the first surface 44a of the third conductive region 44 does not extend to the reference plane 10. The reference 10 and cutting 20 planes are parallel in a y-z plane. The unit cell 15 comprises alternating layers having a nonconductive layer 42 in between the first conductive layer 40 and the second conductive layer 41.

The unit cell 15 of FIG. 2 comprises first 120 and second 130 opposing faces. The first face 120 is parallel to the reference plane 10, and the second face 130 is parallel to a cutting plane 20. The reference 10 and cutting 20 planes are parallel in the y-z plane. Electrically responsive elements 100, 105 are separable at a cutting plane 20 and/or reference plane 10 where the first surface 43a of the first conductive region 43 and the second surface 44b of the third conductive region 44 are exposed on the first 120 and second 130 opposing faces, respectively.

The unit cell 15 of FIG. 2 illustrates a nonconductive layer 42 having a third surface 42c adjacent to the fourth surface 43d of the first conductive region 43 of the first conductive layer 40. The fourth surface 42d of the nonconductive layer 42 is adjacent to the third surface 44c of the third conductive region 44 of the second conductive layer 41. The interstices 25 may contain polymeric nonconductive material 47.

The electronically responsive elements 100, 105 of the article 5 of FIG. 1 are unpolarized for use as components of a group selected from actuators, sensors, pyroelectric devices, capacitors, and piezoelectric devices. These elements 100, 105 typically comprise alternating layers of conductive and nonconductive materials. The number of layers of an element 100 may be defined by the design of the layering assembly 400 of FIG. 3 used with appropriate extrusion equipment. Similarly, the dimensions of an element 100 may be subject to the design of a particular construction and a defined user application.

In one embodiment, the conductive 40, 41 and nonconductive 42 layers of an element 100 of FIG. 1 have controlled thicknesses. The thickness of the layers is based on the layering assembly 400 design and corresponding downstream extrusion equipment. The element 100 preferably has conductive layers 40, 41 that are as thin as possible for subsequent use in a device without losing conductivity. The nonconductive 42 and conductive 40, 41 layers are typically symmetrical and preferably as thin as possible in order to maximize the electrical conductivity of the elements within a device. The first 120 and second 130 opposing faces are used to separate first 100 and second 105 elements at cutting planes 20, 24 and/or reference plane 10. The cutting 20, 24 and/or reference 10 planes expose the first surface 43a of first conductive region 43, and the second surface 44b of the third conductive region 44 to the first 120 and second 130 opposing faces of the elements 100, 105 as illustrated in FIG. 2.

Figure 3:
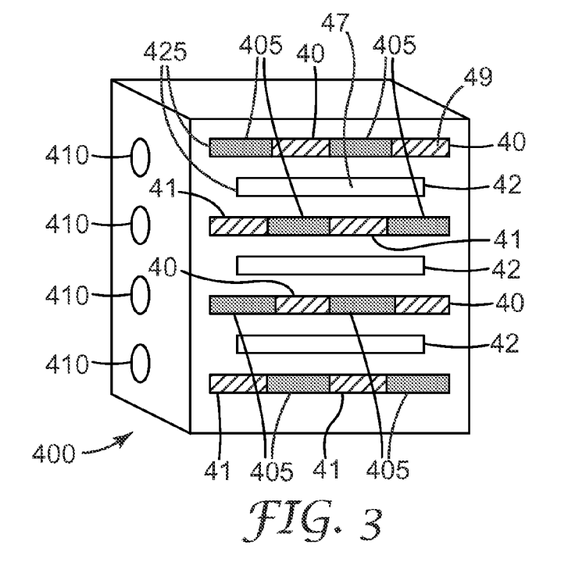
FIG. 3 is a schematic representation of a layering assembly for forming an article having first and second electrically responsive elements.
Figure 4:
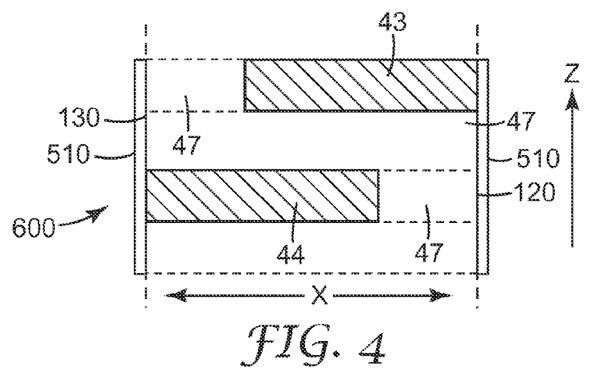
FIG. 4 is a schematic representation of a first device having a conductive coating on both faces.

In one embodiment, the unit cell 15 of FIG. 2 may be used as component of a first device 600 illustrated in FIG. 4. The first device 600 may be coated with a second conductive material 510 on the first 120 and second 130 opposing faces. The first surface 43a of the first conductive region 43 and the second surface 44b of the third conductive region are exposed at the first 120 and second 130 faces of FIG. 2, respectively. The first device 600 may comprises additional alternating conductive 40, 41 and nonconductive 42 layers extending in the z-direction. The x- and z-dimensions of a first device 600 may be defined by the layering assembly 400 of FIG. 3.

The second conductive material 510 used to electrically interconnect the exposed surfaces 43a, 44b of the conductive regions 43, 44 of FIG. 4 on faces 120, 130 may be of many types. Examples include, but are not limited to, solder, silver, other conductive metals, conductive polymers and polymers containing conductive fillers. The second conductive material 510 is preferably applied across each of the opposing faces 120, 130 so as to electrically interconnect all of the exposed surfaces 43a, 44b of the conductive regions 43, 44 to either of the faces 120, 130. Conducting wires may be further attached to the second conductive material 510 followed by poling of the first device 600.

Figure 5:
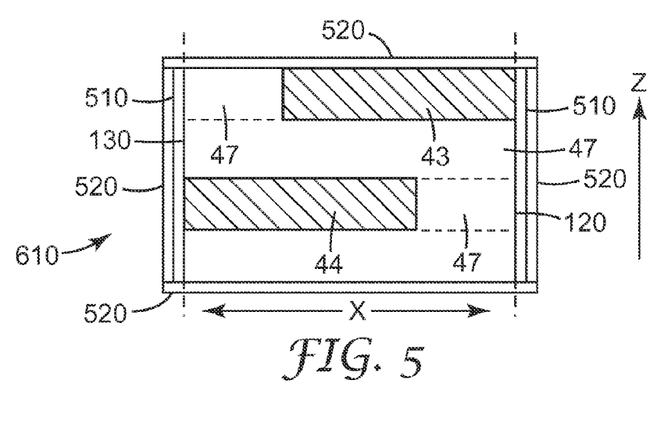
FIG. 5 is a schematic representation of a second device coated with an insulative layer.

FIG. 5 illustrates a second device 610 having an insulative coating or layer 520. The device 610 may be further coated with an insulative layer 520 on faces 120, 130 and any remaining faces in the x-y and x-z planes. The insulative layer 520 of second device 610 assists in reducing moisture and vapor penetration of the first and second conductive layers 40, 41, as well as to reduce the possibility of electrical discontinuity across the second device 610.

A device 610 comprising an element 100 having thin layer thicknesses typically has a voltage level of less than 10 volts. As the thickness of the layers decreases, the lower the applied driving voltage needed for a given application. The device 610 may also have a modulus of elasticity in a range of 0.1 MPa-10 GPa.

Figure 6:
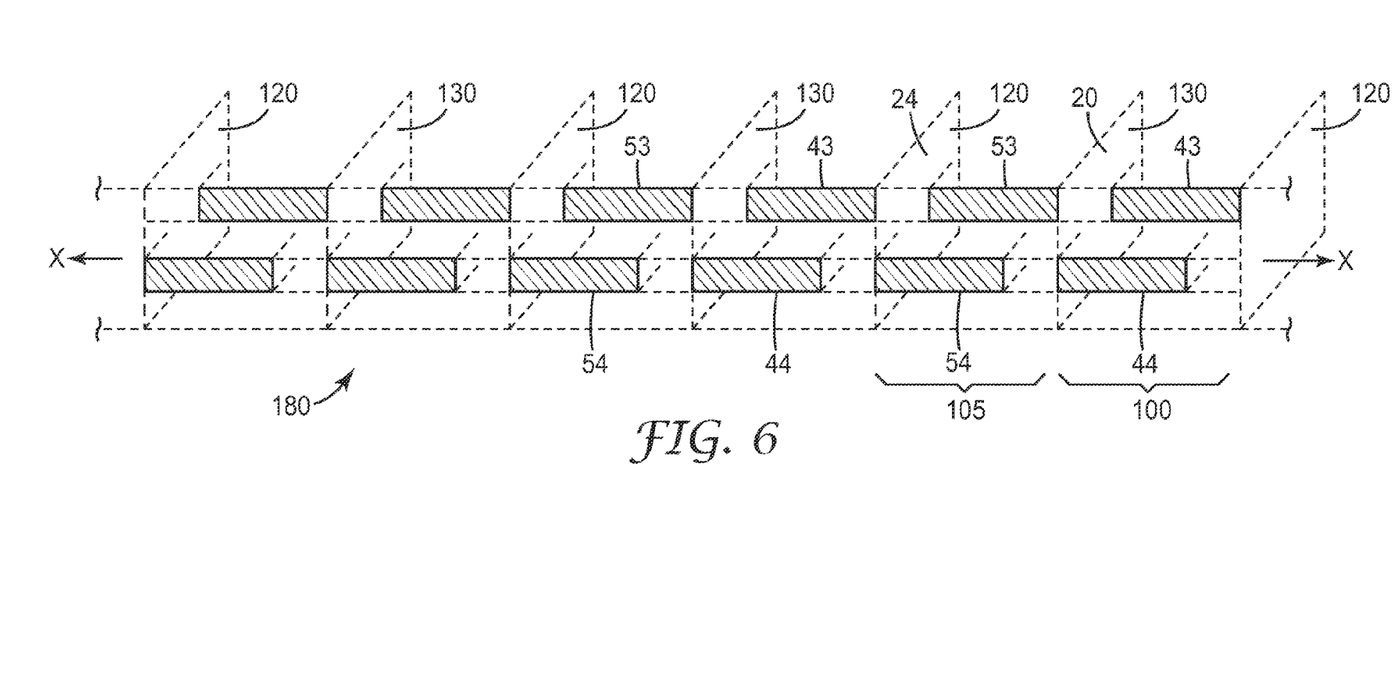
FIG. 6 is a schematic representation of an article comprising electrically responsive elements repeating in the x-dimension.

FIG. 6 illustrates an article 180 having at least first 100 and second 105 electrically responsive elements, where the elements 100, 105 are repeating in the x-dimension. The elements 100, 105 are separable by one or more cutting planes 20, 24. The exposed first 120 and second 130 opposing faces of the elements 100, 105 result from separation of the elements 100, 105 at the cutting 20, 24 and/or reference 10 planes. First conductive layer 40 comprises first 43 and second 53 conductive regions which are discontinuous in the x-dimension. Similarly, third 44 and fourth 54 conductive regions of the second conductive layer 41 are discontinuous in the x-dimension. The elements 100, 105 are made from the unit cell 15 as illustrated in FIG. 2.

In one embodiment, the article 5 of FIG. 1 contains a plurality of electronically responsive elements 100, 105, where the elements are separable by n−1 cutting planes 20, 24. The cutting planes 20, 24 are perpendicular to the x-dimension of the article. A plurality of elements 100, 105 comprises n unit cells 15 having n−1 cutting planes 20, 24, wherein n is at least 3.

Figure 7:
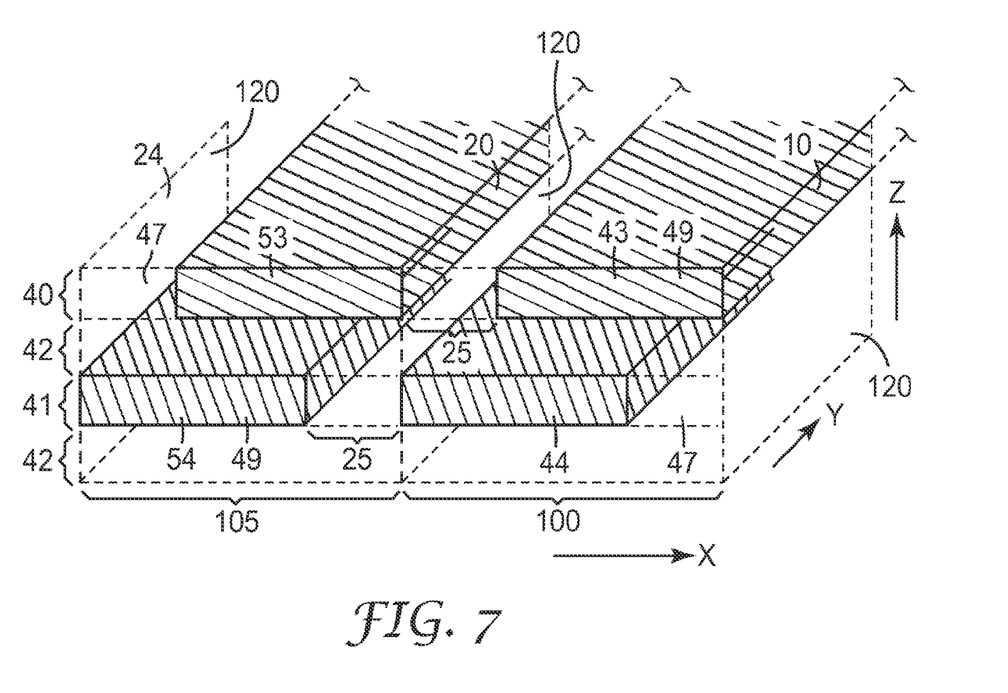
FIG. 7 is a schematic representation of an article having at least two electrically responsive elements presented in the x-, y- and z-dimensions.

In one embodiment, article 180 comprises first 100 and second 105 electrically responsive elements repeating in the x-dimension of FIG. 6. The elements preferably comprise symmetrical nonconductive 42 and conductive 40, 41 layers. Preferably, the electrically responsive elements 100, 105 repeat in the x-dimension in a range of 2 to 1000 unit cells 15. More preferably, the elements 100, 105 repeat in a range of 5 to 500 unit cells 15, and more preferably in a range of 25 to 250 unit cells 15. Further, the elements 100, 105 extend continuously in the y-dimension as illustrated in FIG. 7. The unit cells 15 may extend in the z-dimension resulting from the number of nonconductive 42 and conductive 40, 41 layers selected as well as the thickness of the individual layers after symmetrically drawing down the nonconductive 42 and conductive 40, 41 layers through an extrusion die.

FIG. 7 illustrates a three-dimensional perspective of article 5 having at least two electrically responsive elements 100, 105 separable at cutting 20, 24 and reference 10 planes. Conductive layers 40, 41 are continuous in the y-dimension, and discontinuous in the x-dimension. Nonconductive layer 42 alternates with the conductive layers 40, 41 where the nonconductive layer 42 is continuous in the x- and y-dimensions. Nonconductive material 47 occupies the interstices 25 between conductive regions 43, 53 of first conductive layer 40, and conductive regions 44, 54 of the second conductive layer 41.

Figure 8:
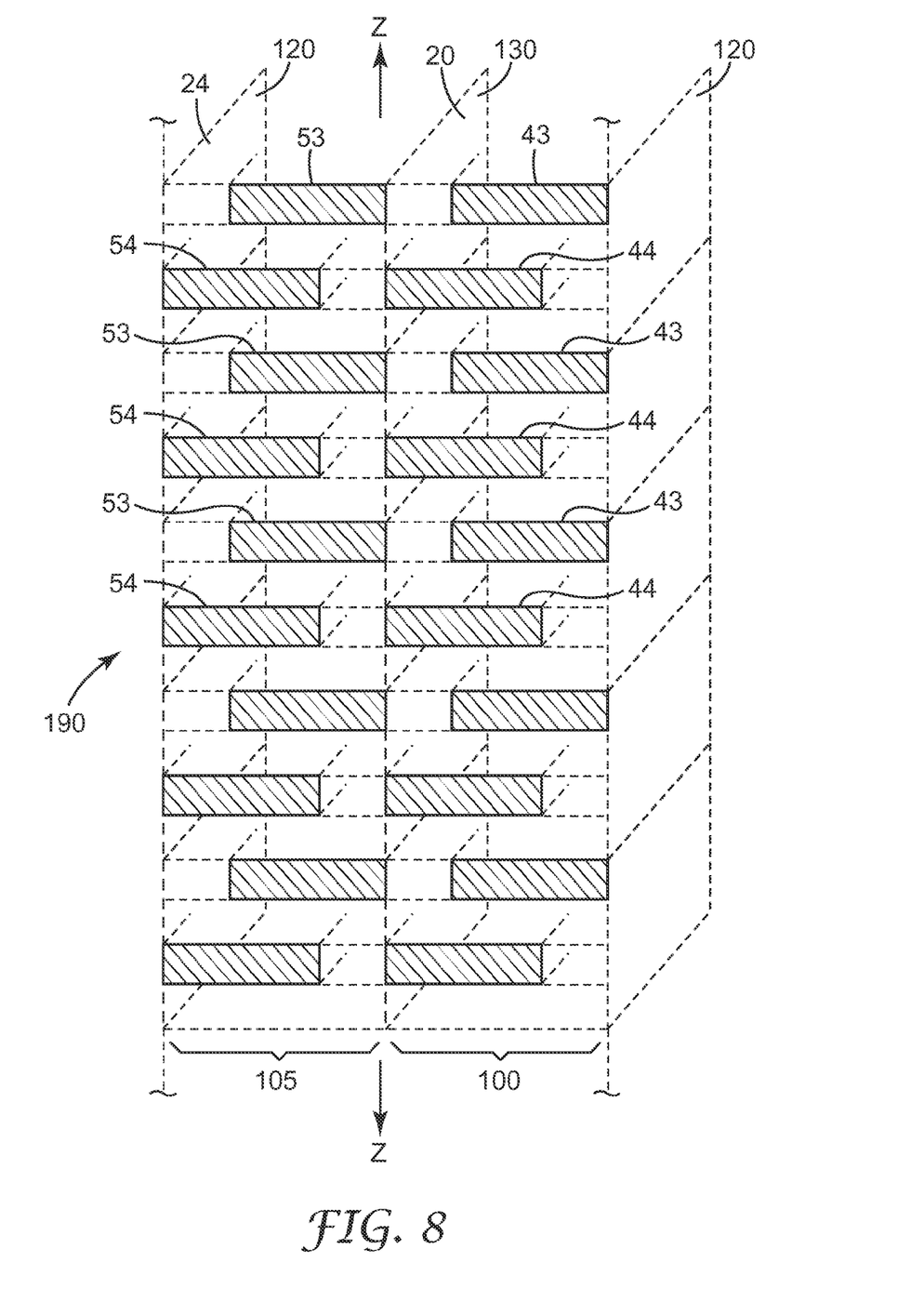
FIG. 8 is a schematic representation of an article comprising electrically responsive elements repeating in the z-dimension.

FIG. 8 illustrates article 190 having at least first 100 and second 105 electrically responsive elements, where the elements 100, 105 have alternating conductive 40, 41 and nonconductive 42 layers repeating in the z-dimension. The z-dimension of article 190 may be defined by the number of conductive 40, 41 and nonconductive 42 layers extruded with layering assembly 400 of FIG. 3, as well as the extent of draw down of the multiple layers after leaving the die orifice. The elements 100, 105 are separable at cutting planes 20, 24. As similarly illustrated in FIG. 1, the first 40 conductive layer comprises first 43 and second 53 conductive regions, and the second 41 conductive layer comprises third 44 and fourth 54 conductive regions repeating in the x-dimension. The cutting planes 20, 24 for separating the elements 100, 105 are perpendicular in the x-dimension. The separation of the elements 100, 105 along cutting planes 20, 24 of article 190 may result in multilayered elements for specific applications.

Figure 9:
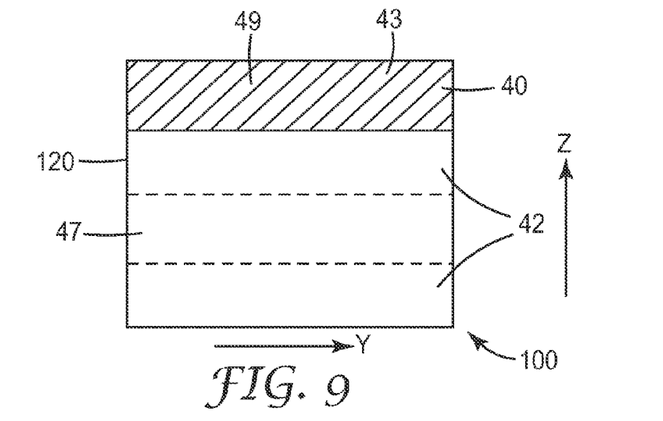
FIG. 9 is a schematic representation of an unit cell viewed in the y-z plane along face 120.

FIG. 9 illustrates a cross-sectional view in the y-z plane of element 100. The first face 120 of element 100 shows alternating conductive 40 and nonconductive 42 layers. In the y-z plane, the layers include a first conductive layer 40, and a nonconductive layer 42. In the z-dimension, the element 100 comprises first conductive layer 40, nonconductive layer 42, nonconductive material 47 of nonconductive region 48 of second conductive layer 41 as illustrated in FIG. 1, followed by a nonconductive layer 42. Nonconductive material 47 may fill the interstices 25 or nonconductive region 48 located between the conductive regions of the first conductive layer 40, where a conductive region does not extend to the reference plane 10 of first face 120. Conductive layer 40 comprises polymeric conductive material 49 of first conductive region 43, which is continuous in the y-dimension. Multiple alternating conductive 40 and nonconductive 42 layers may be coextruded for forming a multilayered element 190 extending in the z-dimension of FIG. 8.

Figure 10:
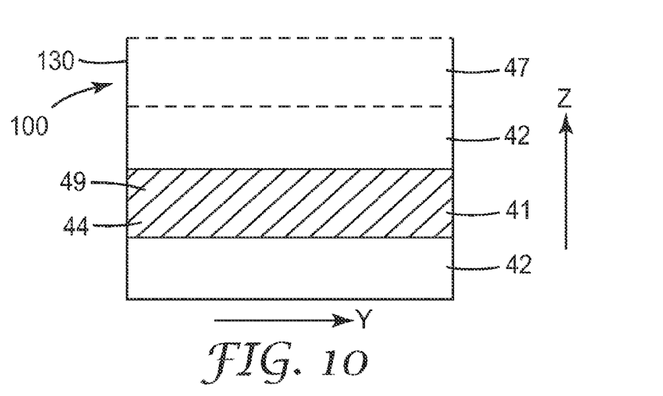
FIG. 10 is a schematic representation of an unit cell viewed in the y-z plane along face 130.

FIG. 10 illustrates a cross-sectional view in the y-z plane of element 100. The second face 130 of element 100 shows alternating conductive 41 and nonconductive 42 layers. In the y-z plane, the layers include nonconductive material 47 of nonconductive region 48 of first conductive layer 40 as illustrated in FIG. 1, a nonconductive layer 42, and a second conductive layer 41, followed by a nonconductive layer 42. Nonconductive material 47 fills the interstices 25 or nonconductive region 48 of first conductive layer 40 of FIG. 9 between the conductive regions. Second conductive layer 41 comprises polymeric conductive material 49 of third conductive region 44, which is continuous in the y-dimension.

Figure 11:
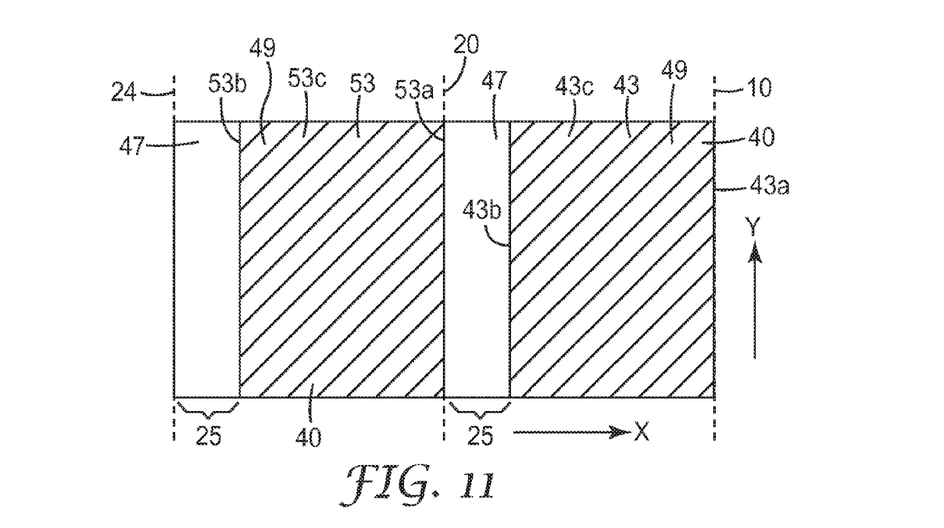
FIG. 11 is a schematic representation of a top view of an article having two electrically responsive elements as viewed in an x-y plane.

FIG. 11 illustrates a cross-sectional view in an x-y plane of article 5 comprising at least first 100 and second 105 electrically responsive elements separable at cutting planes 20, 24 and/or reference plane 10. Elements 100, 105 are shown with first 43 and second 53 conductive regions of the first conductive layer 40 having interstices 25 filled with a nonconductive material 47. The first surface 43a of the first conductive region 43 is coincident with reference plane 10, where the second surface 43b does not extend to the first cutting plane 20. Similarly, the first surface 53a of second conductive region 53 of the first conductive layer 40 is coincident with the first cutting plane 20, where the second surface 53b does not extend to the second cutting plane 24. Third surface 43c of a first conductive region 43 and third surface 53c of second conductive region 53 are the uppermost surfaces in the x-y plane illustrated in FIG. 11.

The shape of the cross-section of article 5 may be affected by the multiple layers during draw down after extrusion through a die orifice. Draw down of the multiple layers or films of article 5 occurs when the polymer melt, i.e. molten material, comes out of a die orifice, and is subsequently pulled away from the exit of die orifice by a chill roll to form the multilayer material or article 5. The final thickness of article 5 in the z-dimension may be different from exiting the die orifice and after draw down. The width or x-dimension of article 5 may also be affected by draw down.

Suitable materials for use in forming article 5 of the present disclosure are any materials that can be thermally processed, that is they are fluid or pumpable at the temperatures used to melt process the layers (e.g., about 50° C. to about 300° C.), and are film formers. These materials do not significantly degrade or gel at the temperatures employed during melt processing, e.g., extruding or compounding. Generally, thermoplastic materials that flow when heated sufficiently above their glass transition temperature and become solid when cooled are used in multilayer film or article applications.

Polymeric materials of the alternating conductive layers 40, 41 may be made from essentially the same materials. Each of the alternating conductive layers 40, 41 may be made of different materials or combinations of materials which may further comprise particles or fillers for conductivity. Similarly, each of the nonconductive layers 42 may include the analogous material or combination of materials to that used in the conductive layers 40, 41, although each individual nonconductive layer 42 may include different materials or combinations of materials from the other nonconductive layers.

The nonconductive layers 42 may further comprise particles to enhance electrical conductivity of an element 100 of a device. With the many possible combinations of materials, it is preferable, however, to form adjacent layers using materials having similar polymer melt viscosities.

In one embodiment, the first polymeric material and organic particles form a polymeric conductive material 49 of the conductive layers 40, 41.

In one embodiment, a first polymeric material is elastomeric.

Thermoplastic materials that have elastomeric properties are typically called thermoplastic elastomeric materials. Thermoplastic elastomeric materials are generally defined as materials that exhibit high resilience and low creep as though they were covalently crosslinked at ambient temperatures, yet process like thermoplastic nonelastomers and flow when heated above their softening point. Thermoplastic elastomeric materials useful in the conductive layer and/or the nonconductive layer as a first polymeric material or one of a blend of polymeric materials include, for example, linear, radial, star, and tapered block copolymers such as those described below.

Examples of a first polymeric material include silicone elastomers, acrylic elastomers, polyurethanes, polybutadienes, thermoplastic elastomers, polybutadiene-acrylonitrile copolymers and combinations thereof.

In one embodiment a first polymeric material is a thermoplastic.

Examples of a thermoplastic first polymeric material include pressure sensitive adhesives, fluoropolymers and polymers comprising silicone and acrylic moieties, and the like. Examples of fluoropolymers include homopolymers such as polyvinylidene difluoride (PVDF), copolymers such as polyvinylidene fluoride-trifluoroethylene P(VDF-TrFE), polyvinylidene fluoride-chlorofluoroethylene P(VDF-CFE), polyvinylidene fluoride-hexafluoropropylene P(VDF-HFP), polyvinylidene fluoride-trifluoroethylene-chlorofluoroethylene P(VDF-TrFE-CFE), polyvinylidene fluoride-trifluoroethylene-chlorotrifluoroethylene P(VDF-TrFE-CTFE), polyvinylidene fluoride-tetrafluoroethylene-chlorotrifluoroethylene, polyvinylidene fluoride-trifluoroethylene-hexafluoropropylene, polyvinylidene fluoride-tetrafluoroethylene-hexafluoropropylene, polyvinylidene fluoride-trifluoroethylene-tetrafluoroethylene, polyvinylidene fluoride-tetrafluoroethylene, polyvinylidene fluoride-trifluoroethylene-vinyl fluoride, polyvinylidene fluoride-tetrafluoroethylene-vinyl fluoride, polyvinylidene fluoride-trifluoroethylene-perfluoro(methyl vinyl ether), polyvinylidene fluoride-tetrafluoroethylene-perfluoro(methyl vinyl ether), polyvinylidene fluoride-trifluoroethylene-bromotrifluoroethylene, polyvinylidene fluoride-tetrafluoroethylene-bromotrifluoroethylene, polyvinylidene fluoride-tetrafluoroethylene-chlorofluoroethylene, polyvinylidene fluoride-trifluoroethylene-vinylidene chloride, and polyvinylidene fluoride-tetrafluoroethylene-vinylidene chloride and combinations thereof.

Examples of organic conductive particles or fillers include graphite, carbon nanotubes, carbon black, and combinations thereof. These materials may be added to the first polymeric material to form a polymeric conductive material 49 for the conductive layers 40, 41. The first polymeric material may be mixed, blended, compounded or by other means with organic materials or fillers to achieve a uniform mixture of materials suitable for forming conductive layers 40, 41.

In one embodiment, the first polymeric material may be blended or mixed with inorganic particles to form conductive layers 40, 41. Examples of inorganic particles or fillers include silver, copper, nickel, aluminum, platinum, palladium, derivatives and combinations thereof. These materials may have irregular shapes or defined structures suitable for forming conductive layers 40, 41.

In one embodiment, the first polymeric material may be blended or mixed with inorganic coated particles to form conductive layers 40, 41. Examples of inorganic materials used for coating particles include gold, silver, palladium, platinum and combinations thereof.

In one embodiment, the first polymeric material may form the polymeric conductive material 49 of the conductive layers 40, 41. Examples of a first polymeric material, which is conductive include poly(3,4-ethylenedioxy thiophene), polyaniline, polypyrrole, polythiophene, polydiacetylene, polyacetylene, polyisothianaphthene, polyheteroarylene-vinylene, wherein the heteroarylene group can for example be thiophene, furan or pyrrole, poly-p-phenylene, polyphenylene sulphide, polyperinaphthalene, polyphthaloxyanine, copolymers of and physical mixtures thereof. The first polymeric material may be conductive with optional particles or fillers.

Optional additives to combine with the conductive first polymeric material may further include dopants, doping agents and combinations thereof. Doping agents comprises iodine, peroxides, Lewis acids and protic acids for doping by oxidation, sodium, potassium and calcium for doping by reduction.

The nonconductive layer 42 comprises a polymeric nonconductive material 47. The polymeric nonconductive material 47 may comprise a first polymeric material as described above. Mixtures or blends of the first polymeric material with other polymeric materials may be utilized to form a nonconductive layer 42. Additives to increase the dielectric constant may be added or compounded with the first polymeric material of nonconductive layer 42. Examples additives include $BaTiO_3$, lead zirconate titanate (PZT), PT (lead titanate) composites, PTCa and combinations thereof. These additives may be compounded with the first polymeric material.

The conductive polymeric material 49 and the nonconductive polymeric material 47 have sufficient viscosity to be extruded or coated onto an adjacent layer of the article 5. An extrudable formulation of a blend of conductive polymeric materials 49, as well as a blend of a conductive polymeric material 49 with a nonconductive material 47 may be utilized.

The first polymeric material of the conductive layers 40, 41 may include conductive polymers, polymeric materials or a blend of polymeric materials rendered conductive. In some instances, the first polymeric material is mixed with organic materials to yield a conductive layer.

The nonconductive 42 and conductive 40, 41 layers being continuous in the y-dimension or the down-web dimension are substantially uniform in thickness to plus or minus 10 percent. Similarly, it is desirable to have thin conductive layers, where the thickness of these layers may be governed by the average diameter or size of the particles to be blended with the first polymeric materials.

Methods for coextruding multiple layer webs, and related equipment are described in U.S. Pat. Nos. 6,949,283 (Kollaja et al.) 5,825,543 (Ouderkirk et al.) and 5,783,120 (Ouderkirk et al.).

FIG. 3 illustrates a coextrusion layering assembly 400 for forming an article 5 having at least first 100 and second 105 electrically responsive elements of FIG. 1. Multiple inlets 410 are supplied at a location on the layering assembly 400, to provide one or more polymeric materials to the die slots 425. Many possible variations for the layering assembly 400 may be plausible for multilayer film elements. Die shims 405 are placed in the die slots 425 of the conductive layers 40, 41 to provide for extrusion of discontinuous first 40 and second 41 conductive layers together with the nonconductive layer 42. Conductive layers 40, 41 alternate with the nonconductive layer 42 as the layers exit the die orifice. The interstices 25 result from the position of the die shims 405 during extrusion of the conductive layers 40, 41. The discontinuous conductive layers 40, 41 result in the formation of conductive regions 43, 53 of the first conductive layer 40, and conductive regions 44, 54 of the second conductive layer 41. The films or layers comprise nonconductive 47 and conductive 49 materials for coextrusion through a die orifice. Nonconductive material 47 may flow into the interstices 25 between conductive regions 43, 53, 44, 54 as the layers exit the die slots 425 and during draw down of the multilayer article. Variations of the coextruded article 5 may result from the design of the layering assembly 400 and subsequent drawdown of the multiple layers.

Generally, the lateral dimensions of the article 5 resulting from the extrusion process may be determined by the dimensions of the die slots 425 of the extrusion layering assembly 400 as well as the extent of symmetric draw down of the individual layers of the multilayer article 5. In general, the width of the article 5 in the x-dimension will be greater than the thickness or z-dimension. The y-dimension of the article relates to the down-web or extrusion direction of the article 5. The x-dimension of elements 100, 105 of article 5 are determined by the width of the die slots 425 for the nonconductive 42 and conductive 40, 41 layers. Die slots 425 for the conductive layers 40, 41 having die shims 405 provides for a discontinuity within the layers 40, 41 extending in the x-dimension. The die slot 425 for the nonconductive layer 42 may be free of die shims 405 to provide a continuous nonconductive layer 42 extending in the x-dimension.

A layering assembly 400 may be designed to accommodate multiple unit cells 15 of the elements 100, 105. Alternating conductive 40, 41 and nonconductive 42 layers may be coextruded to form a plurality of elements 100, 105 repeating in the x-dimension being separable by cutting planes 20, 24 as illustrated in FIG. 6. The layering assembly 400 may be designed or modified to increase or decrease the number of elements in the x-dimension. Die shims 405 of die slots 425 may vary in the x- and z-dimensions. Die slots 425 may be extended in the x-dimension for forming n elements as per layering assembly 400 designs.

The layering assembly 400 may be designed to coextrude multiple alternating conductive 40, 41 and nonconductive 42 layers extending in the z-direction as illustrated in FIG. 8.

Preferably, each layer extruded through the layering assembly 400 is uniform in thickness. The layers may have different thicknesses as they exit a die orifice. The alternating layers after exiting the die orifice may vary as a result of the extent of draw down through a die orifice resulting in an article 5. The extent of draw down is in a range of 2:1 to 12:1. The draw down is based on the ratio of the die gap thickness (at the exit to the die) relative to the finished thickness of the element 100 in the z-dimension.

In one embodiment, the thicknesses of the conductive 40, 41 layers of the article 5 are in a range of 0.05 micrometer to 100 micrometers. More preferably, the thickness of the layers is in a range of 0.5 micrometer to 50 micrometers, and most preferably in a range of 1 to 25 micrometers. The conductive layers 40, 41 are preferably as thin as possible having controlled thicknesses without losing electrical conductivity in an element 100. The thickness of the conductive 40, 41 layers may be limited to the diameter or size of the organic or inorganic particles compounded with the first polymeric material.

In one embodiment, the thickness of the nonconductive layer 42 of the element 100 is in a range of 0.5 micrometer to 150 micrometers. More preferably, the thickness of the nonconductive 42 is in a range of 1 micrometer to 75 micrometers, and most preferably in a range of 2 micrometers to 50 micrometers. The thickness of the non conductive 42 layers may be limited to the diameter or size of the organic or inorganic particles optionally compounded with the first polymeric material.

In one embodiment, the layering assembly 400 has die slots 425 extending in the x-dimension, where the number of extrudable elements 100, 105 has alternating conductive 40, 41 and nonconductive 42 layers in a range of 2 to 1000. Preferably, the number of elements 100, 105 is in a range from 5 to 250. More preferably, the number of elements 100, 105 is in a range of 10 to 200, and most preferably in a range of 15 to 100. The elements are separable at n–1 cutting planes 20, 24 being perpendicular to the x-dimension and parallel to the y-z plane. The width of the interstices 25 between conductive elements 43, 44 is in a range of 0.001 micrometer to 5 micrometers. More preferably, the width of the interstices 25 is in a range of 0.01 micrometer to 3 micrometers, and most preferably in a range of 0.1 micrometer to 1 micrometer.

In one aspect, a multilayer article 5 comprises multiple layers disposed on each other as they exit the die orifice. As illustrated in FIG. 1, the article 5 may have a conductive layer 40 as the uppermost layer in the z-dimension alternating with a nonconductive layer 42. The nonconductive layer 42 alternates with the conductive layers 40, 41 to provide at least two conductive layers where the first and second surfaces of the regions are exposed on the opposing faces 120, 130 of the element 100. The number of layers may be limited to the die layering assembly 400 design as well as to the application for the elements. The multiple layered structures may also comprise more than one polymeric material in the conductive and nonconductive layers. The polymeric materials may differ in order to modify the elasticity or stiffness of the article 5, as well as to modify the conductivity or electrical storage of an element 100, 105.

The number of conductive layers 40, 41 comprising polymeric conductive material 49 may be determined by the number of die slots 425 of the layering assembly 400. The number of conductive layers 40, 41 having conductive regions 43, 53, 44, 54 and nonconductive regions 48 is in a range of 2 to about 200. More preferably, the number of conductive layers 40, 41 is in a range of 2 to 150, and most preferably in a range of 3 to 100.

The numbers of nonconductive layers 42 comprising polymeric nonconductive material 47 may be determined by the number of die slots 425 present in layering assembly 400. The number of nonconductive layers 42 is in a range of 1 to 100. More preferably, the number of nonconductive layers 42 is in a range of 1 to 75, and most preferably in a range of 2 to 50.

In one aspect, an article 5 is described comprising at least two electrically responsive elements 100, 105 having alternating layers of polymeric nonconductive material 47 and polymeric conductive 49 materials. The nonconductive layer 42 comprises nonconductive material having third 42c and fourth 42d surfaces. The polymeric conductive material 49 is adjacent to each of the third 42c and fourth 42d surfaces of the polymeric nonconductive material 47. The polymeric conductive material 49 is arranged so that a single surface of each successive layer is alternatingly exposed to one of two opposing faces 120, 130 of the article 5. The two separate faces 120, 130 are parallel to the single surface of each successive layer. The successive layers comprise alternating regions of a polymeric conductive material 49 and a polymeric nonconductive material 47. The alternating regions extend in the x-dimension, and are perpendicular to that of the two parallel separate faces 120, 130.

In one embodiment, the article 5 comprises a plane parallel to the two separate faces 120, 130, where the plane separates two adjacent elements 100, 105. Each element 100, 105 contains alternating layers of polymeric conductive material 49 having alternating regions of polymeric conductive material 49 and polymeric nonconductive material 47. The cutting planes 20, 24 may be identified as being perpendicular to the x-dimension and extending in the x-z plane.

In one embodiment, the article 5 comprises greater than two alternating regions of polymeric conductive material 49. The alternating regions comprise a conductive region and first interstice 25 following by another conductive region and a second interstice 25. The interstices 25 may contain polymeric nonconductive material 47. The polymeric nonconductive material 47 fills the interstices after the layers exit the layering assembly 400.

In one embodiment, the article 5 has at least two cutting planes 20, 24. The cutting planes 20, 24 separate at least two elements 100, 105. The cutting planes 20, 24 separate the greater than two alternating regions of polymer conductive material 49 of the conductive layers 40, 41.

In one aspect, a method for making an article 5 on a continuous medium is described. The medium may be a moving belt, web or film for supporting the article 5 as it is made or extruded. The article 5 may be coextruded where n electrically responsive elements 100, 105 are formed. The medium moves the article 5 from the extrusion die orifice providing continuous formation of the elements 100, 105. The adjacent elements 100, 105 extend in the x-direction, and are separated by n–1 cutting planes 20, 24 which are perpendicular to the x-dimension. The cutting planes 20, 24 are parallel to one another in the y-z plane. At least two elements 100, 105 are formed where n=2.

In one aspect, an article 5 is made from first and second resins, which are coextruded. The first and second resins are polymeric materials. The first resin forms the nonconductive layer 42 having third 42c and fourth 42d opposing surfaces. The second resin forms at least two conductive layers 40, 41 where each of the conductive layers 40, 41 is adjacent to the third 42c and second 42d opposing surfaces of the nonconductive layer 42. The first and second resins are coextruded where the nonconductive layer 42 is continuous in the x- and y-dimensions. The conductive layers 40, 41 are discontinuous in the x-dimension and substantially continuous in the y-dimension.

In one aspect, an article 5 is made by a method for coextruding n electrically responsive elements 100, 105 on a continuous medium. Adjacent electrically responsive elements 100, 105 are separated by n–1 cutting planes 20, 24. The planes 20, 24 are perpendicular to the x-dimension and n is at least 2.

The invention will be further clarified by the following examples which are exemplary and not intended to limit the scope of the invention.

EXAMPLES

Unless otherwise noted, all parts, percentages, and ratios reported in the following examples are on a weight basis, and all reagents used in the examples were obtained, or are available, from the chemical suppliers described below, or may be synthesized by conventional techniques.

Example 1

A unit cell of FIG. 2 as a component of an actuator of the present disclosure was prepared. An electrically responsive element comprising multiple layers was made using nonconductive polyurethane (TEXIN DP7-1196; Bayer Materials Science, Baytown, Tex.) elastomer layers, and conductive layers made of polyurethane elastomer (ESTANE 58224; Noveon, Cleveland, Ohio) filled with 6 weight percent carbon black particles (KETJENBLACK EC600JD, Akzo Nobel; Chicago, Ill.). The conductive polyurethane melt (with carbon black) was pre-compounded prior to extruding. A Coperion 40:1 L/D corotating twin screw extruder (Stuttgart, Germany) having 10 heating zones was used with a standard screw design, and a temperature profile of 20° C. for zone 1, and zone temperatures of 180° C. thereafter.

The polyurethane melt (nonconductive layer) was extruded using a 1.25 inch (3.175 cm) Killion single screw extruder (Davis Standard Extrusion, Stamford, Conn.) using a standard screw design with a Saxton (Xaloy, Hickory, N.C.) mixing tip. The single screw extruder had 4 heated barrel zones with set points (from hopper to exit) at 280° F. (138° C.); 350° F. (177° C.); 430° F. (221° C.); 440° F. (227° C.). A heated stainless steel transfer tube (TW Metals, Rogers, Minn.) was fastened at the exit of the Killion single screw extruder discharging to a layering assembly. Layering assemblies are known in the art. U.S. Pat. No. 3,924,990 (Schrenk) teaches one example of layering assemblies. The layering assembly used was schematically like FIG. 3, but modified in that there was only one shim per die slot. The shims were located on alternating edges of the die slots. The compounded conductive melt (conductive layer) was extruded using a Baker Perkins 40 mm corotating twin screw extruder (Baker Perkins Corporation, Grand Rapids, Mich.) with a standard screw design operated at 400 rpms, 44% torque and 10 kg/hr. The twin screw extruder had four heated barrel zones with set points (from hopper to exit) set at 350° F. (177° C.); 450° F. (230° C.); 450° F. (230° C.); 450° F. (230° C.). The Baker Perkins extruder was also connected to the layering assembly via a heated stainless steel tube.

The layering assembly split the two polymer melt streams (nonconductive and conductive polymer melts) into a plurality of separate streams and formed alternating layers according to its design. The conductive layered portions were shaped so that they did not extend across the total width of the flow channel; rather, the non-conductive layers filled in the interstices between the conductive portions. The shaped multilayered melt flowed into a die assembly comprising a die orifice essentially as described in U.S. Pat. No. 3,924,990 (Schrenk), where it was further shaped into a web having 5 layers. The layers were comprised of 3 nonconductive and 2 conductive layers. The weight ratio of the conductive to nonconductive material was 40:60. The web was then cooled via a chilled drum, and wound using an electric winder having a magnetic clutch. The films were cast at 5 feet (1.524 meters) per minute with the cooling drum set at 60° F. (16° C.). The extruded web width was 6 inches (15.24 cm), and 30 mils (762 micrometers) thick. A 2:1 draw down of the web was observed using the above apparatus.

Prophetic Example

An article comprising at least two elements for use as a component of an actuator of the present disclosure is disclosed. This example is analogous to Example 1 except that the layering assembly is equipped with the die shims 405 shown in FIG. 3 to produce the article of FIG. 1.

The article would have a cutting plane to separate the first and second electrically responsive elements at the two opposing faces 120, 130. The two elements could be separated by slitting at a cutting plane where the first and second surfaces of the conductive regions of the conductive layers would be exposed on the faces of the elements. The first conductive layer would have a conductive region exposed on the first face of the element and not extending to the second face. The second conductive layer would have a conductive region exposed on the second face of the element and not extending to the first face.

Various modifications and alterations of this invention will be apparent to those skilled in the art without departing from the scope and spirit of this invention, and it should be understood that this invention is not limited to the illustrative elements set forth herein.

What is claimed is:

1. An article having an x-dimension, a y-dimension and a z-dimension, the three dimensions being mutually orthogonal, the article comprising:
   a. at least two conductive layers extending in the x-dimension, each conductive layer comprising alternating conductive regions and nonconductive regions;
   b. at least one nonconductive layer; and
   wherein the at least two conductive layers and the at least one nonconductive layer alternate in the z-dimension
      wherein the at least two conductive layers and the at least one nonconductive layer form at least a first and a second electrically responsive element, wherein the at least one nonconductive layer of the first electrically responsive element and the at least one nonconductive layer of the second electrically responsive element form a substantially continuous nonconductive layer in the x-dimension;
      wherein the at least first and second electrically responsive elements each have two opposing faces coincident with the y-z plane,
      wherein the first electrically responsive element comprises a first conductive region; and a third conductive region,
         wherein the first conductive region has a first surface and the third conductive region has a second surface,
         wherein the first surface of the first conductive region is exposed to a first opposing face of the first element and the second surface of the third conductive region is exposed to a second opposing face of the first element
      wherein the second electrically responsive element comprises a second conductive region; and a fourth conductive region,
         wherein the second conductive region has a first surface and the fourth conductive region has a second surface,
         wherein the first surface of the second conductive region is exposed to a first opposing face of the second element and the second surface of the fourth conductive region is exposed to a second opposing face of the second element
      wherein the first conductive layer comprises the first and second conductive regions and the second conductive layer comprises the third and fourth conductive regions.

2. The article of claim 1, wherein the first and second electrically responsive elements are each made from a unit cell, each unit cell independently comprising:
- at least a portion of the at least one nonconductive layer, and
- at least a portion of each of the at least two conductive layers.

3. The article according to claim 2, wherein
the nonconductive layer comprises a polymeric nonconductive material having third and fourth surfaces that are continuous along the x-dimension and the y-dimension;
the at least two conductive layers each comprise polymeric conductive material,
wherein the first surface of the first conductive region of the first conductive layer is coincident with a reference plane, and the second surface of the first conductive region of the first conductive layer not extending to a cutting plane; the second surface of the third conductive region of the second conductive layer coincident with the cutting plane having the first surface of the third conductive region of the second conductive layer not extending to the reference plane; the reference and cutting planes being coincident with faces and in a y-z plane.

4. The article of claim 2, wherein a plurality of electrically responsive elements is defined by n unit cells and n−1 cutting planes, wherein n is at least 3.

5. The article of claim 3, wherein the third surface of the nonconductive layer is adjacent to the fourth surface of the first conductive region of the first conductive layer; and the fourth surface of the nonconductive layer is adjacent to the third surface of the third conductive region of the second conductive layer.

6. The article of claim 1, wherein the first and second electrically responsive elements each have a cross-section defined by an x-z plane; the cross-section providing a nonconductive layer having a third and fourth surfaces; the nonconductive layer in between a first and second conductive layers; the first conductive layer adjacent to the third surface of the nonconductive layer, and the second conductive layer adjacent to the fourth surface of the nonconductive layer; the first conductive layer having at least first and second conductive regions having interstices between the conductive regions; the second conductive layer having at least third and fourth conductive elements having interstices between the conductive regions;
wherein the conductive regions of the first and second conductive layers repeat in the x-dimension.

7. The article of claim 2, wherein the first and second electrically responsive elements repeat in the x-dimension.

8. The article of claim 7, wherein the first and second electrically responsive elements repeat in the x-dimension in a range of 2 to 1000 unit cells.

9. The article of claim 1, wherein n electrically responsive elements are separable by n−1 cutting planes between adjacent electrically responsive elements, wherein n is at least 3.

10. The article of claim 6, wherein interstices between the conductive regions of the conductive layers comprise a polymeric nonconductive material.

11. The article of claim 3, wherein the polymeric conductive material comprises a polymeric material and organic fillers.

12. The article of claim 11, wherein the polymeric material is selected from the group consisting of polyurethanes, polyolefins, fluorinated polyolefins, polyacrylates, polyacrylonitrile-butyl rubber copolymers, polymethyl methacrylate and combinations thereof.

13. The article of claim 11, wherein the organic fillers are selected from the group consisting of carbon black, carbon nanotubes and combinations thereof.

14. The article of claim 3, wherein the polymeric nonconductive material is selected from the group polyurethanes, polyolefins, fluorinated polyolefins, polyacrylates, polyacrylonitrile-butyl rubber copolymers and combinations thereof.

15. A method of making an article of claim 1 on a continuous medium comprising:
coextruding n electrically responsive elements on a continuous medium; wherein the adjacent electrically responsive elements extending in the x-dimension are separated by n−1 cutting planes perpendicular to an x-dimension; wherein n is at least 2.

16. A method of making an article of claim 1 comprising:
a) providing a first resin to form at least a nonconductive layer having third and fourth opposing surfaces;
b) providing a second resin to form at least two conductive layers; each of the two conductive layers being adjacent to the third and fourth opposing surfaces of the nonconductive layer; and
c) coextruding the first and second resins; the first resin providing at least one nonconductive layer that is substantially continuous in the x- and y-dimensions;
the second resin providing at least two conductive layers that are discontinuous in the x-dimension; the conductive layers each having alternating conductive and nonconductive regions; the conductive regions having first and second surfaces perpendicular to the third and fourth opposing surfaces of the nonconductive layer;
wherein the first or second surfaces of the conductive regions are coincident to at least one cutting plane; the cutting plane being perpendicular to the x-dimension.

17. An article having an x-dimension, a y-dimension and a z-dimension, the three dimensions being mutually orthogonal, the article comprising:
a. at least two elastomeric conductive layers extending in the x-dimension, each elastomeric conductive layer comprising alternating elastomeric conductive regions and elastomeric nonconductive regions;
b. at least one elastomeric nonconductive layer; and
wherein the at least two elastomeric conductive layers and the at least one elastomeric
nonconductive layer alternate in the z-dimension
wherein the at least two elastomeric conductive layers and the at least one elastomeric nonconductive layer form at least a first and a second electrically responsive element,
wherein the at least one elastomeric nonconductive layer in the first electrically responsive element and the at least one elastomeric nonconductive layer in the second electrically responsive element form a substantially continuous nonconductive layer in the x-dimension;
wherein the at least first and second electrically responsive elements each have two opposing faces coincident with the y-z plane,
wherein the first electrically responsive element comprises a first elastomeric conductive region; and a third elastomeric conductive region,
wherein the first elastomeric conductive region has a first surface and the third elastomeric conductive region has a second surface,
wherein the first surface of the first elastomeric conductive region is exposed to a first opposing face of the first element and the second surface of the third elastomeric conductive region is exposed to a second opposing face of the first element wherein the second electrically responsive element comprises a second elastomeric conductive region; and a fourth elastomeric conductive region, wherein the second elastomeric conductive region has a first surface and the fourth elastomeric conductive region has a second surface, wherein the first surface of the second elastomeric conductive region is exposed to a first opposing face of the second element and the second surface of the fourth elastomeric conductive region is exposed to a second opposing face of the second element wherein the first elastomeric conductive layer comprises the first and second elastomeric conductive regions and the second elastomeric conductive layer comprises the third and fourth elastomeric conductive regions.

18. The article of claim 17, wherein the electrically responsive element is a component of a device selected from the group consisting of actuators, sensors, capacitors and combinations thereof.

* * * * *

UNITED STATES PATENT AND TRADEMARK OFFICE
CERTIFICATE OF CORRECTION

Page 1 of 1

PATENT NO.        : 7,777,397 B2
APPLICATION NO.   : 11/684700
DATED             : August 17, 2010
INVENTOR(S)       : Vivek Bharti et al.

It is certified that error appears in the above-identified patent and that said Letters Patent is hereby corrected as shown below:

Column 1
Line 23; After "devices" insert -- . --.

Column 11
Line 18; Delete "polyphthaloxyanine," and insert -- polyphthaloxyamine, --, therefor.

Signed and Sealed this
Twenty-fifth Day of January, 2011

David J. Kappos
*Director of the United States Patent and Trademark Office*